Figure 1:
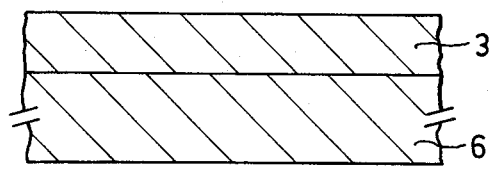

United States Patent [19]
Landheer et al.

[11] 3,935,586
[45] Jan. 27, 1976

[54] SEMICONDUCTOR DEVICE HAVING A SCHOTTKY JUNCTION AND METHOD OF MANUFACTURING SAME

[75] Inventors: Frits Landheer; Hermanus Josephus Henricus Wilting, both of Eindhoven, Netherlands

[73] Assignee: U.S. Philips Corporation, New York, N.Y.

[22] Filed: Feb. 7, 1975

[21] Appl. No.: 547,997

Related U.S. Application Data

[63] Continuation of Ser. No. 369,988, June 14, 1973.

[30] Foreign Application Priority Data

June 29, 1972 Netherlands.................... 7208995

[52] U.S. Cl. ................ 357/15; 357/16; 357/23; 427/84
[51] Int. Cl.²................ H01L 29/48; H01L 29/56
[58] Field of Search ............ 427/84; 357/15, 16, 23

[56] References Cited
UNITED STATES PATENTS

| | | | |
|---|---|---|---|
| 3,636,417 | 1/1972 | Kimura | 317/234 |
| 3,669,730 | 6/1972 | Lepselter | 117/200 |
| 3,767,984 | 10/1973 | Shinoda | 317/235 R |

OTHER PUBLICATIONS

Sze, Physics of Semiconductor Devices, Wiley & Son, N.Y., 1969, pp. 366–367.

Primary Examiner—Martin H. Edlow
Attorney, Agent, or Firm—Frank R. Trifari; Leon Nigohosian

[57] ABSTRACT

A semiconductor device having a Schottky junction formed by providing a semiconductor body at least two metal layers one on top of the other which can each form a Schottky barrier with the semiconductor, in which, according to the invention, the formed Schottky diode has a higher barrier than each of the metals individually relative to the semiconductor, by heating the assembly above 400°C. Preferably nickel or cobalt is first provided and thereon aluminum, and heating is carried out at 500°C.

14 Claims, 10 Drawing Figures

SEMICONDUCTOR DEVICE HAVING A SCHOTTKY JUNCTION AND METHOD OF MANUFACTURING SAME

This is a continuation, of application Ser. No. 369,988, filed June 14, 1973.

The invention relates to a semiconductor device having a rectifying metal-to-semiconductor junction comprising a semiconductor body having a region of one conductivity type adjoining a surface and having at least a first metal layer which is provided on the surface of said region and a second metal layer of another metal which is provided on the first metal layer and makes no contact with the semiconductor material, in which the metals of the first and of the second metal layer can both form a rectifying junction with the semiconductor material of the said region.

The invention furthermore relates to a method of manufacturing the device.

Devices of the type described are known, for example, from the published German Offenlegungsschrift 1,564,870.

Rectifying metal-to-semiconductor junctions, usually referred to as Schottky junctions, are frequently used in semiconductor technology, for example, as a diode, for switching purposes in which a high switching speed is required. Said high switching speed in a Schottky junction is obtained inter alia in that, since majority charge carriers are used, the stored charge in a Schottky junction is very small and in particular much smaller than in a p-n junction.

In general it is desirable that the reverse leakage current of the Schottky junction be as low as possible.

In order to achieve this, a metal-to-semiconductor junction may be used having a barrier height which is as large as possible. Barrier height of a Schottky junction is to be understood to mean the energetic distance between the Fermi level and the conductance band, at the interface between the metal and the semiconductor material.

Such a Schottky junction having a very high barrier (0.80 – 0.82 eV) is formed, for example, between platinum silicide and n-type silicon. However, the technology for manufacturing such a junction is rather complicated. For example, at least two vapour deposition steps are necessary in which a treatment outside the vacuum is to be carried out between the two vapour deposition steps. Furthermore, platinum is a very expensive material. Other metals or alloys which also have a barrier height of 0.80 eV or more relative to silicon, are scarce and have several drawbacks such as, for example, gold which does not readily withstand high temperatures and often presents technological difficulties, in particular in combination with aluminium ("purple plague,") or, in particular when used in integrated circuits, by its poor adhesion to silicon dioxide.

One of the objects of the invention is to provide a semiconductor device having a rectifying metal-to-semiconductor junction with a large barrier height while using a simple technology in which comparatively cheap metals can be used.

According to the invention, a semiconductor device having a rectifying metal-to-semiconductor junction of the type described in the preamble is characterized in that the barrier height of the junction between the first metal layer and the said region is larger than the barrier height of a junction of each of the said metals individually with the semiconductor material of said region.

The invention is inter alia based on the recognition of the fact that it has surprisingly proved possible to make Schottky junctions with a very large barrier height by providing on a semiconductor material at least two metal layers which are present one on top of each other and which each individually can form only a Schottky junction with the semiconductor material the barrier height of which is lower than that of the diode according to the invention. The explanation of said phenomenon is yet clear.

The first metal preferably has a lower barrier height relative to the said region than the second metal.

It has proved in practice that for this purpose are particularly suitable the metals nickel and aluminium in combination with n-type silicon as the semiconductor material. By providing in a suitable manner on an n-type silicon surface a nickel layer and thereon an aluminium layer, a Schottky barrier of approximately 0.85 – 0.86 eV is obtained in a reproducible manner at the interface nickel-silicon, although both the barrier height between the n-type silicon and nickel only and that between n-type silicon and aluminium only are considerably lower than 0.85 eV. In addition, both metals can very readily be treated, in particular etched, and are cheap. Another useful combination is a composite layer of cobalt with aluminium on top. Cobalt alone gives a barrier of 0.64 eV whereas the composite layer may provide a barrier of 0.90 eV.

In order to reach this result, according to the invention the two metal layers are successively provided on the surface of a semiconductor region of one conductivity type, after which a thermal treatment is applied to the assembly at a temperature of at least 400°C. A particularly good result is obtained when on an n-type silicon region first a layer of nickel is provided after which a layer of aluminium is provided on said nickel layer. The thermal treatment is preferably carried out at a temperature of at least 400°C and at most 577°C (the eutectic temperature of Al-Si) and preferably at substantially 500°C, for example, in nitrogen. Without said temperature treatment, or with temperature treatments considerably below said temperature, a barrier height equal to that of nickel, so of approximately 0.66 eV, is obtained.

A very good result is obtained when the first layer has a thickess of substantially 0.1 micron and the aluminum layer has a thickness of substantially 1 micron.

Although the nickel may be deposited first, the substrate then be removed from the vapour deposition apparatus and the aluminium then be vapour-deposited in a second vapour deposition step, the two metal layers will preferably be provided after each other in one single vapour deposition step, in which the substrate is not removed from the vapour deposition device between the vapour deposition of the first layer and the vapour deposition of the second layer.

Schottky junctions having a high barrier are particularly suitable for use as gate electrodes in field effect transistors. An important preferred embodiment according to the invention is therefore characterized in that the metal-to-semiconductor contact constitutes a gate electrode of a field effect transistor, the said region consisting of an epitaxial layer which is provided on a substrate of the opposite conductivity type.

Figure 4:
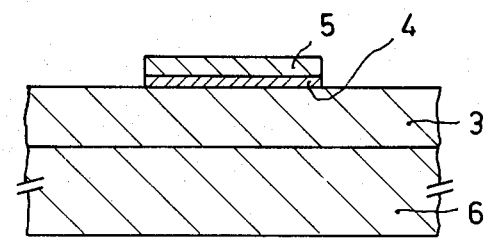
Figure 5:
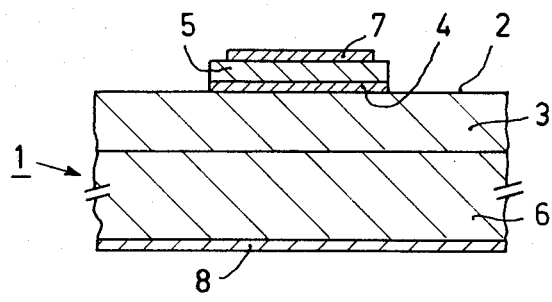
Figure 6:
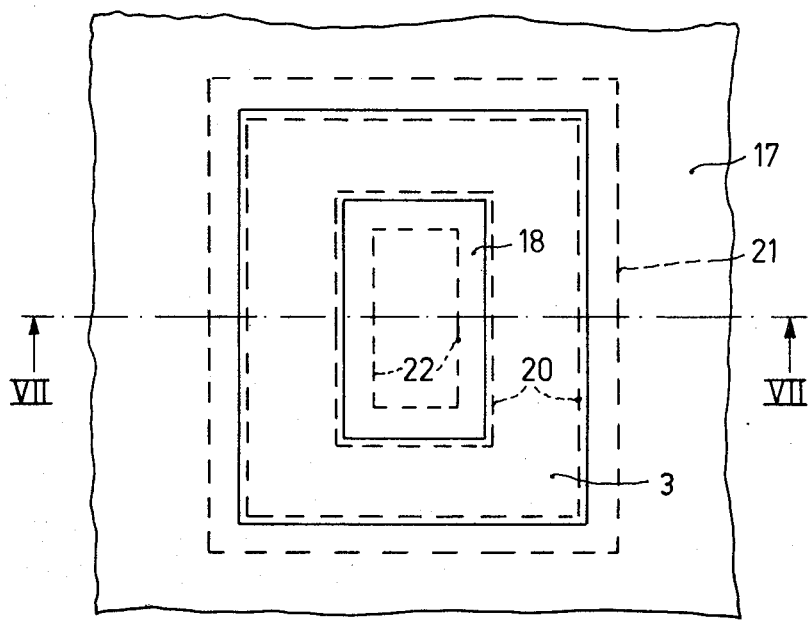
Figure 7:
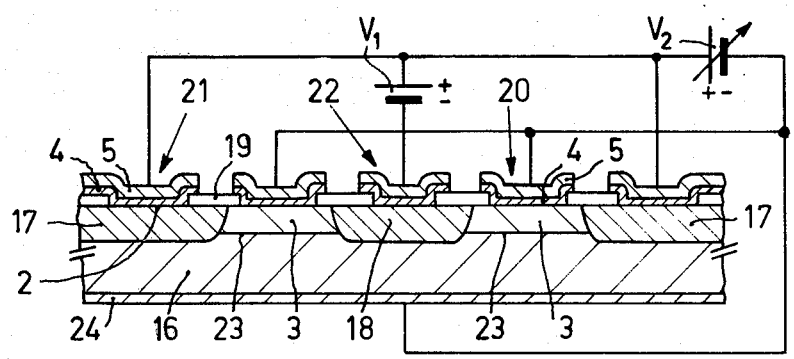
Figure 8:
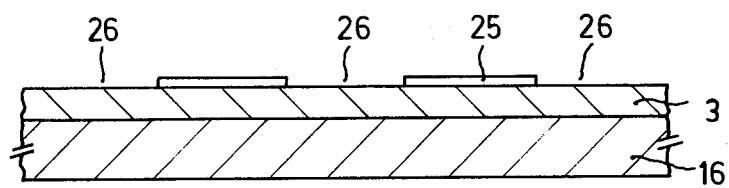

The invention will now be described in greater detail with reference to a few embodiments and the drawing, in which FIGS. 1 to 5 are diagrammatic cross-sectional views of a device according to the invention in successive stages of manufacture, FIG. 6 is a plan view of another device according to the invention, FIG. 7 is a diagrammatic cross-sectional view taken on the line VII—VII of the device shown in FIG. 6 and FIGS. 8 to 10 are diagrammatic cross-sectional views of the device shown in FIGS. 6 and 7 in successive stages of manufacture.

The Figures are diagrammatic and not drawn to scale. Corresponding parts in the Figures are generally referred to by the same reference numerals. The outlines of metal layers are denoted by a broken line in FIG. 6.

FIG. 5 is a diagrammatic cross-sectional view of a semiconductor device according to the invention, in this example Schottky diode. The device comprises a semiconductor body 1 of silicon having an n-type conductive region 3 adjoining a surface 2 and a first metal layer 4 of nickel provided on the surface 2 of said region 3 in a thickness of substantially 0.1 micron, and a second metal layer 5 of aluminium provided on said first metal layer 4 in a thickness of substantially 1 micron which does not contact the silicon. In this example, the region 3 is a 10 micron thick epitaxial layer having a resistivity of 2 ohm. cm grown on a substrate 6 of n-type silicon having a resistivity of 0.01 Ohm. cm. The layer 5 and the substrate 6 are contacted by means of electrode layers 7 and 8, for example, of gold.

The layers 4 and 3 constitute a rectifying metal-to-semiconductor junction ("Schottky" junction) having a barrier height of 0.86 eV. This is higher than the barrier which each of the metals nickel and aluminium individually can form with the layer 3. Actually, said barrier heights are 0.66 eV for nickel and 0.71 eV for aluminium.

The Schottky diode shown in FIG. 5 can be manufactured, for example, as follows. On a substrate 6 (FIG. 1) of n-type silicon having a resistivity of 0.01 ohm.cm, an epitaxial layer 3 having a thickness of 10 microns and a resistivity of 2 ohm.cm is grown in the usual manner. The surface of the layer 3 is then cleaned very carefully, for example, by boiling in a mixture of sulphuric acid and hydrogen peroxide in water, rinsing in deionized water, exposing to hydrofluoric acid gas for approximately 5 seconds and boiling in methanol for approximately 15 minutes. A nickel layer 4 (FIG. 12), 0.1 micron thick, and an aluminium layer 5, 1 micron thick, are then vapour-deposited successively in a vacuum of $10^{-6}$ mm mercury pressure or less in one vapour deposition step without removing the substrate from the vapour deposition apparatus.

Figure 2:
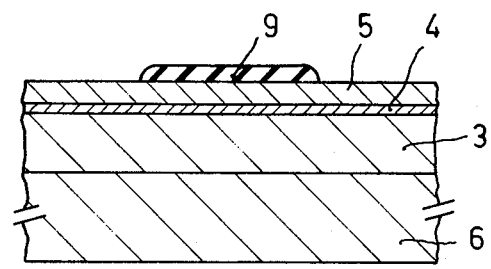
Figure 3:
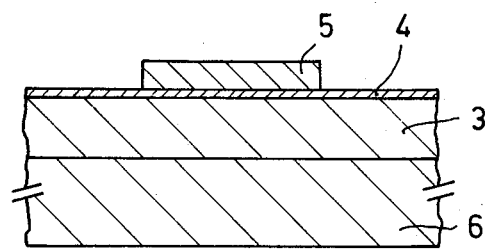

A photoresist mask 9 is then provided (see FIG. 2). The aluminium layer 5 is given its ultimate shape by etching with phosphoric acid (FIG. 3). The nickel layer 4 is then etched with nitric acid (which does not attack the aluminium), so that the structure of FIG. 4 is obtained. The assembly is then heated in an atmosphere of nitrogen at a temperature of 500°C for 15 minutes. The electrode layers 7 and 8, on which further connection conductors may be mounted, are finally provided on the layer 5 and on the substrate 6 (the thickness of which may be reduced previously by a material-removing treatment) while using conventionally used methods. The assembly then is provided in a suitable encapsulation.

FIG. 6 is a diagrammatic plan view and FIG. 7 a diagrammatic cross-sectional view taken on the line VII—VII of FIG. 6 of another device according to the invention. The device in this example is a field effect transister comprising a substrate 16 of p-type silicon having a resistivity of 10 ohm cm, a 2 microns thick n-type conductive epitaxial layer 3 having a resistivity of 4 ohm. cm grown on the substrate 16, and n-type source and drain zones 17 and 18 adjoining the substrate 16 and diffused in said layer 3, the source zone 17 surrounding the drain zone 18 entirely. The zones 17 and 18 are highly doped with a surface concentration of approximately $10^{20}$ at/cm$^3$ phosphorus.

A layer 19 of silicon oxide is provided on the surface 2 of the semiconductor body. The nickel layer 4 and an aluminium layer 5 are provided in a window in the oxide layer 19, on the region 3 which constitutes the channel region of the field effect transistor. As a result of this a gate electrode 20 is obtained which forms, with the channel region 3, a Schottky junction having a very high barrier of 0.86 eV. In other windows in the oxide layer 19, the composite layer (4, 5) forms ohmic source and drain electrodes 21 and 22 with the highly doped n-type source and drain zones 17 and 18.

The gate electrode (see FIG. 7) is connected electrically to the electrode layer 24 on the substrate 16. A voltage source $V_1$ is connected between the source and drain electrodes 21 and 22. A voltage in the reverse direction is applied by the voltage source $V_2$ across the p-n junction 23 and across the Schottky junction (4/3), as a result of which a depletion zone extends from said junctions into the channel region 3. By varying the voltage of the voltage source V2, and with the voltage of the voltage source V1 remaining the same, the current from the source electrode 21 to the drain electrode 22 via the channel region 3 can thereby be varied. As a result of the high barrier of the Schottky junction (4/3), the leakage current through the gate electrode is very low.

The field effect transistor may be manufactured, for example, as follows. An n-type silicon layer 3 having a resistivity of 4 ohm.cm is grown on a p-type silicon substrate 16 having a resistivity of 10 ohm.cm. On said layer an oxide layer 25 is provided thermally in which layer apertures 26 are etched (see FIG. 8) by using known photolithographic etching methods. Phosphorus is diffused through said apertures so as to form the source and drain zones 17 and 18.

Figure 9:
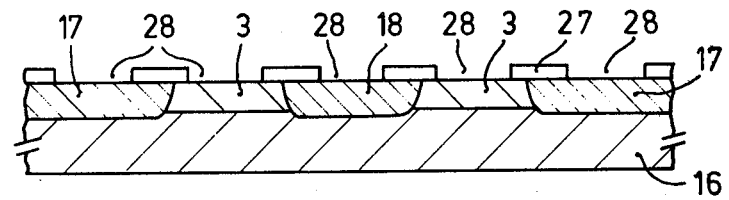

The oxide and the phosphor silicate glass are then entirely removed from the surface and a new oxide layer 27 is grown thermally. Windows 28 are etched in said oxide layer 27 as a result of which the structure shown in FIG. 9 is obtained.

The area within the windows 28 is then carefully cleaned by a short dip in a solution of hydrofluoric acid (HF) and ammonium fluoride (NH$_4$F), the oxide 27 being only slightly attacked.

Figure 10:
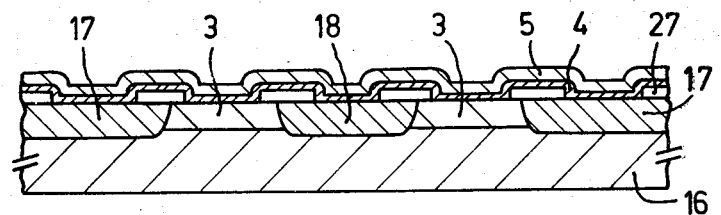

In the manner described in the preceding example, a nickel layer 4 and an aluminium layer 5 are then vapour-deposited, see FIG. 10. By using photolithographic etching methods, analogous to those of the preceding example, the double layer (4, 5) is then etched to the desired pattern after which a thermal treatment at 500°C in nitrogen for 15 minutes is again carried out. The electrode layer 24 may be provided at any desired moment of the process. In this manner the structure shown in FIG. 7 is obtained.

It will be obvious that the invention is not restricted to the embodiments described but that many variations are possible to those skilled in the art without departing from the scope of this invention. For example, the invention may be used in particular to manufacture a Schottky gate electrode of a field effect transistor having a more complex strucrure than that shown in FIGS. 6 and 7. The diode shown in FIG. 5 may be provided, for example, in a window in an oxide layer, the nickel — aluminium layer being partly present on the oxide. This will generally be the case when providing such a diode in an integrated circuit. In addition other materials may be used, for example, instead of a layer of silicon oxide, a layer of aluminium oxide or silicon nitride. Instead of nickel with aluminium on top, a composite layer of for instance cobalt with aluminium on top may be applied, which gives after heating at 500° a barrier of 0,90 eV whereas the barrier of cobalt alone on n-type silicon is 0,64 eV. The heating may be carried out at any other temperature above 400° instead of at 500°, while the heating time is not critical. Also composite metal layers of more than two metal layers on top of each other may be used.

What is claimed is:

1. A semiconductor device having a rectifying metal-to-semiconductor junction, and produced by the method comprising:
   a. providing a semiconductor body having a first conductivity region adjoining a surface of said body;
   b. providing a first metal layer on only the surface of said first region to form a rectifying junction;
   c. providing a second metal layer on said first metal layer and out of contact with said first region surface, said first and second layers comprising a layer structure, the respective said metals of said first and second layers being different from each other and being characterized by being capable of individually forming a rectifying junction with said semiconductor material of said region when disposed directly thereon, the ultimate barrier height of the junction between said first metal layer of said layer structure and said region being larger than the barrier heights of the respective junctions of said metals individually with said semiconductor material of said region; and then
   d. subjecting the thus-produced assembly to a thermal treatment of at least 400°C, whereby said ultimate barrier height is attained.

2. A semiconductor device as in claim 1, wherein said barrier height of said first metal relative to the said region is lower than that of said second metal.

3. A semiconductor device as in claim 2, wherein said semiconductor material of said region is n-type silicon and said first metal layer consists essentially of nickel and said second metal layer consists essentially of aluminum.

4. A semiconductor device as in claim 2, wherein said semiconductor material of said region is n-type silicon and said first metal layer consists essentially of cobalt and said second metal layer consists essentially of aluminum.

5. A semiconductor device as in claim 2, wherein said first metal layer consists essentially of one of nickel and cobalt and has a thickness of substantially 0.1 micron and said second metal layer consists essentially of aluminum and has a thickness of substantially 1 micron.

6. A semiconductor device as in claim 1, wherein said body comprises a field effect transistor and said metal layers constitute a gate electrode therefor, said semiconductor region consisting of an epitaxial layer provided on a substrate of said first conductivity type.

7. A method of manufacturing a semiconductor device having a rectifying metal-to-semiconductor junction, comprising the steps of:
   a. providing a semiconductor body having a first region adjoining a surface of said body;
   b. providing a first metal layer on only the surface of said first region to form a rectifying junction;
   c. providing a second metal layer on said first metal layer and out of contact with said first region surface, said first and second layers comprising a layer structure, the respective said metals of said first and second layers being different from each other and being capable of individually forming a rectifying junction with said semiconductor material of said region, when disposed directly thereon, the metal of said first layer of said layer structure exhibiting a barrier height relative to the semiconductor region which is lower than that of the metal of said second layer, and then
   d. subjecting the thus-produced assembly to a thermal treatment of at least 400°C, so as to provide a rectifying junction between said region and said layer structure having a barrier height exceeding those of the junctions individually formed by said first and second layers.

8. A method as in claim 7, wherein said step of forming said first metal layer comprises forming a nickel layer on an n-type silicon said region and said second metal layer is formed by providing an aluminum layer on said nickel first layer.

9. A method as in claim 7, wherein said step of forming said first layer comprises forming a cobalt layer on an n-type silicon said region and said second metal layer is formed by providing an aluminum layer on said cobalt first layer.

10. A method as in claim 7, wherein said step of thermally treating said assembly is carried out at a temperature of at most about 577°C.

11. A method as in claim 10, wherein said temperature treatment step is carried out at substantially 500°C.

12. A method as in claim 7, wherein said two metal layers are vapor-deposited successively in single vapor deposition operation.

13. A method as in claim 7, wherein a field effect transistor is produced, wherein said step of forming said semiconductor body comprises the steps of epitaxially forming a layer of n-type silicon on a substrate of opposite conductivity type, and said method further comprising the steps of forming source and drain electrodes of said epitaxial layer, and wherein said first and second metal layers are provided on the epitaxial layer between said source and drain electrodes.

14. A semiconductor device as in claim 1, wherein said body comprises a field effect transistor and said metal layers constitute a gate electrode therefor, said body comprising a substrate of said first conductivity type, an epitaxial layer of a second opposite conductivity type disposed on said substrate, and said first conductivity region disposed at said epitaxial layer.

\* \* \* \* \*